United States Patent
Chang et al.

(10) Patent No.: US 6,888,071 B2
(45) Date of Patent: May 3, 2005

(54) LAYOUT STRUCTURE AND METHOD FOR SUPPORTING TWO DIFFERENT PACKAGE TECHNIQUES OF CPU

(75) Inventors: Nai-Shung Chang, Taipei Hsien (TW); Tsai-Sheng Chen, Taipei Hsien (TW); Shu-Hui Chen, Taipei Hsien (TW)

(73) Assignee: VIA Technologies, Inc., Taipei Hsien (TW)

(*) Notice: Subject to any disclaimer, the term of this patent is extended or adjusted under 35 U.S.C. 154(b) by 0 days.

(21) Appl. No.: 10/710,731

(22) Filed: Jul. 30, 2004

(65) Prior Publication Data

US 2004/0251534 A1 Dec. 16, 2004

Related U.S. Application Data

(62) Division of application No. 10/064,426, filed on Jul. 12, 2002, now Pat. No. 6,794,744.

(30) Foreign Application Priority Data

Jan. 28, 2002 (TW) .......................... 91101325 A

(51) Int. Cl.⁷ ................................ H05K 1/03
(52) U.S. Cl. .............. 174/255; 174/261; 361/760; 361/761
(58) Field of Search ............... 174/255, 261; 361/760–761

(56) References Cited

U.S. PATENT DOCUMENTS 6,198,635 B1 * 3/2001 Shenoy et al. .............. 361/760
6,229,095 B1 * 5/2001 Kobayashi .................. 174/255

* cited by examiner

Primary Examiner—Luan Thai
(74) Attorney, Agent, or Firm—Jianq Chyun IP Office

(57) ABSTRACT

A layout structure of a central processing unit (CPU) that supports two different package techniques, comprising a motherboard that comprises the layout structure and a layout method. The layout structure of the preferred embodiment according to the present invention from up to down sequentially places a top signal layer, a grounded layer, a power layer having a grounded potential, and a bottom solder layer in the area where the signals of the CPU are coupled to the signals of the control chip, so that the signals that are placed on the bottom solder layer can refer to a grounded potential area of the power layer. Therefore, part of signals of the CPU that are coupled to the control chip can be placed on the bottom solder layer. Since the preferred embodiment of the present invention provides more flexibility in the placement design, a layout structure that supports the Pentium IV CPUs of different package techniques can be designed on the motherboard of the 4 layers stack structure, and these two CPUs can be supported by the same control chip.

11 Claims, 2 Drawing Sheets

LAYOUT STRUCTURE AND METHOD FOR SUPPORTING TWO DIFFERENT PACKAGE TECHNIQUES OF CPU

CROSS REFERENCE TO RELATED APPLICATIONS

This application is a divisional of a prior application Ser. No. 10/064,426, filed Jul. 12, 2002, now U.S. Pat. No. 6,794,744 which claims the priority benefit of Taiwan application serial no. 91101325, filed Jan. 28, 2002.

BACKGROUND OF INVENTION

1. Field of Invention

The present invention generally relates to a layout structure and method, more particularly, to a layout structure and method for supporting central processing units having two different package techniques.

2. Description of Related Art

The Pentium IV central processing unit (abbreviated as CPU) developed by Intel Corporation has two different package types: one type of CPU has 423 pins and uses the pin grid array (abbreviated as PGA) package; the other type of CPU has 478 pins and uses the ball grid array (abbreviated as BGA) package. Since these two different package techniques are configured on a motherboard that has 6 layers and 4 layers stack structure respectively, it needs to use a layout structure of different printed circuit boards and has to cooperate with different north bridge control chips to work properly. Therefore, it is not only inconvenient in usage, but also the manufacture cost is increased.

The conventional stack structure of the printed circuit board of the 423 pins Pentium IV CPU is shown in Table 1:

TABLE 1

| Top Signal Layer |
| Grounded Layer |
| Inner Signal Layer |
| Grounded Layer |
| Power Layer |
| Bottom Solder Layer |

From Table 1, the printed circuit board uses a 6 layers stack structure. From up to down, the stack structure sequentially comprises a top signal layer, a grounded layer, an inner signal layer, a grounded layer, a power layer, and a bottom solder layer. FIG. 1 schematically shows a power layer cut ichnography in the area where the signals of the north bridge control chip 102 are coupled to the signals of the CPU 100 in the layout structure of a motherboard that supports the 423 pins Pentium IV CPU. From Table 1, since all the signals of the north bridge control chip 102 that are coupled to the CPU 100 are placed on the top signal layer and the grounded layer, all the signals of the north bridge control chip 102 that are coupled to the CPU 100 can refer to the grounded layer. Therefore, high quality of the signal transmission can be assured. On the other hand, from the layout structure of Table 1 and FIG. 1, since the power layer 104 of the north bridge control chip 102 that is coupled to the CPU 100 does not comprise a grounded potential, if the signals of the north bridge control chip 102 that are coupled to the CPU 100 are to be placed on the bottom solder layer, it has to cross over the power layer 104 to refer to the grounded area, thus the signal transmission quality is not as good as in the top signal layer. Consequently, the conventional bottom solder layer is seldom used to place the signals of the north bridge control chip that are coupled to the CPU.

On the other hand, the stack structure of the conventional printed circuit board that supports the 478 pins Pentium IV CPU is shown in Table 2:

TABLE 2

| The area of the north bridge control chip where its signals are not coupled to the CPU (The third area) | The area of the north bridge control chip where its signals are coupled to the CPU (The second area) | CPU (The first area) |
| --- | --- | --- |
| Top Signal Layer | Top Signal Layer | Top Signal Layer |
| GND | GND | GND |
| The Cut Layer of the interface operating voltage source | GND | GND |
| Bottom Solder Layer | Bottom Solder Layer | Bottom Solder Layer |

From Table 2, the printed circuit board uses a 4 layers stack structure, comprising: a first area, where the whole CPU is placed in the first area; a second area, all the signals of the north bridge control chip that are coupled to the CPU are placed in the second area; a third area, all the signals of the north bridge control chip that are not coupled to the CPU are placed in the third area. From Table 2, the stack structure of the first area from up to down sequentially comprises a top signal layer, a grounded layer (GND), a power layer having an interface operating voltage source (to generate a voltage source via the appropriate cutting, and each interface voltage source varies based on the difference of the connected devices), and a bottom solder layer. The stack structure of the second area and third area from up to down sequentially comprises a top signal layer, a grounded layer, a grounded layer, and a bottom solder layer. All the signals of the Intel designed north bridge control chip that are connected to the CPU are placed on the top signal layer, and all refer to the contiguous grounded layer. However, since most of the signals are placed on the top signal layer, thus the area used by the north bridge control chip is increased, and greater printed circuit board is demanded to constitute the control chip, moreover the area of the north bridge control chip that is coupled to the CPU is also increased accordingly, so that the demand of the layout length can be met. These limitations cause great concern in designing the north bridge control chip and the motherboard.

Obviously, since the stack structure of these two Intel Pentium IV CPUs mentioned above are different, the prior art has to use two different layout structures and printed circuit boards to support two different Intel Pentium IV CPUs that have different package types. As a result, Intel has been forced to develop two different types of the north bridge control chip to support the corresponding Pentium IV CPU respectively. Consequently, in order to support the Intel Pentium IV CPUs of two different package types, not only does the motherboard need to be relaid out, but the north bridge control chip also needs to be replaced. This results in usage inconveniency and cost increase.

SUMMARY OF INVENTION

Therefore, the present invention provides a layout structure and its layout method to configure a layout structure that supports the CPUs of two different package techniques on a 4 layers structure motherboard. Furthermore, the north bridge control chip used by the present invention can support two different types of the Intel Pentium IV CPU. Therefore, the usage convenience can be improved and the cost can be saved.

In order to achieve the objective mentioned above and other objectives, the layout structure of the preferred embodiment according to the present invention from up to down sequentially comprises: a first signal layer; a first reference layer having a first reference potential; a second reference layer having a first reference area and a second reference area, the first reference area comprises a first reference potential, the second reference area comprises a second reference potential; and a second signal layer. Wherein, the layout structure is placed in the area between the CPU that and the control chip, and the first reference potential can be a grounded potential.

In the preferred embodiment of the present invention, the first reference potential in the second reference layer is placed in one side of the north bridge control chip nearest the CPU, and the second reference layer cuts into the north bridge control chip from the other side.

The present invention further provides a motherboard that supports the CPUs of two different package techniques, the motherboard is used to place the CPU and the control chip, comprising: a first area, the whole CPU is placed in the range of the first area, the stack structure of the first area from up to down sequentially comprises a first signal layer; a first reference layer having a first reference potential; a second reference layer having a first reference area and a second reference area, the first reference area comprises a first reference potential, the second reference area comprises a second reference potential; and a second signal layer. The motherboard further comprises a second area, all the signals of the control chip that are coupled to the CPU are placed in the range of the second area, the stack structure of the second area from up to down sequentially comprises a third signal layer; a third reference layer having a first reference potential; a fourth reference layer having a third reference area and a fourth reference area, the third reference area comprises a first reference potential, the fourth reference area comprises a second reference potential; and a fourth signal layer. The motherboard further comprises a third area, all the signals of the control chip that are not coupled to the CPU are placed in the range of the third area, the stack structure of the third area from up to down sequentially comprises a fifth signal layer; a fifth reference layer having a first reference potential; a sixth reference layer having a plurality of reference areas that have a plurality of other reference potentials; and a sixth signal layer. Therefore, the CPUs that are manufactured by both different package techniques can be placed on the motherboard of the preferred embodiment according to the present invention, and a single north bridge control chip can be used to support the CPU operation.

The present invention further provides a layout method for supporting the CPUs of two different package techniques, the method is used to place the signal lines in the area where the signals of the CPU are coupled to the signals of the control chip. The layout method comprises the steps of: at first, providing a printed circuit board to constitute a motherboard, the printed circuit board is used to place the 4 layers stack structure motherboard, comprising a top signal layer, a grounded layer having a grounded potential, a power layer, and a bottom solder layer; then, placing the signal lines on the top signal layer and the bottom solder layer, wherein the high frequency signal lines can be placed on the top signal layer and the bottom solder layer that are in the area where the control chip is coupled to the CPU; afterwards, cutting the printed circuit board that is to be used to constitute the power layer, in addition to generate the voltage sources needed by the operating interfaces, also cutting an area on the power layer where the control chip is coupled to the CPU to generate an area that is coupled to the grounded potential; finally, combining the printed circuit board mentioned above to constitute a stack structure that from up to down sequentially comprises a top signal layer, a grounded layer having a grounded potential, a power layer having a grounded potential, and a bottom solder layer.

In summary, since the embodiment of the present invention provides a more flexible space for the placement design, the layout structure can be configured on the 4 layers motherboard to support the Intel Pentium IV CPUs of two different package types. Moreover, the usage convenience can be improved without increasing the cost. Since all the signals of the control chip that are coupled to the CPU refer to the grounded potential, the quality of the signal transmission can be assured.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 2:
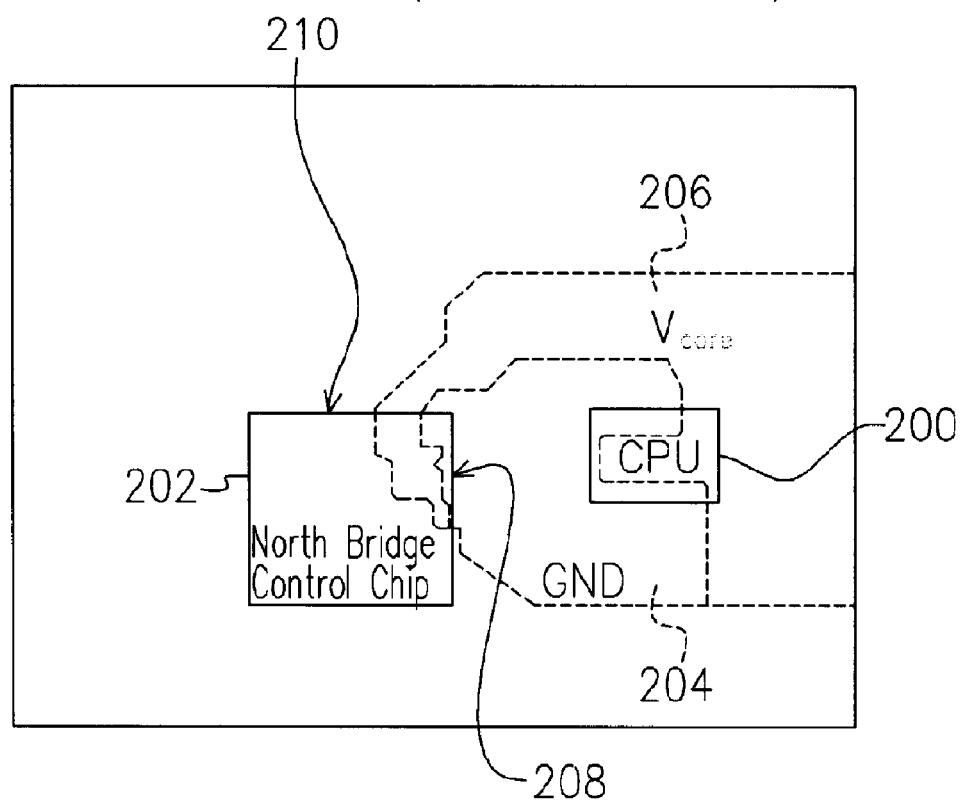
FIG. 2 schematically shows a power layer cut ichnography in the area where the north bridge control chip is coupled to the CPU in the preferred embodiment of the present invention.

In order to support both 423 and 478 pin Intel Pentium IV CPUs, the layout structure of the preferred embodiment according to the present invention configures the area where the control chip is coupled to the CPU on the 4 layers motherboard from up to down sequentially as a top signal layer, a grounded layer having a grounded potential, a power layer, and a bottom solder layer. Wherein, the power layer comprises a first reference area having a grounded potential and a second reference area having different interface operating voltage sources. FIG. 2 schematically shows a power layer cut ichnography in the preferred embodiment of the present invention. From FIG. 2, the power layer where the north bridge control chip 202 is coupled to the CPU 200 has been cut off to constitute a first reference area 204 and a second reference area 206. The first reference area 204 is placed near the right hand side 208 of the north bridge control chip 202 (i.e. the side nearest the CPU 200), it is also the area coupled to the grounded potential; the second reference area 206 is placed in the area that is formed from the north bridge control chip 202 cutting into the upper side 210 (the upper side 210 and the right hand side 208 are contiguous sides), it is also the area coupled to the CPU operating voltage (all other interface operating voltages are not shown in the diagram).

Figure 1:
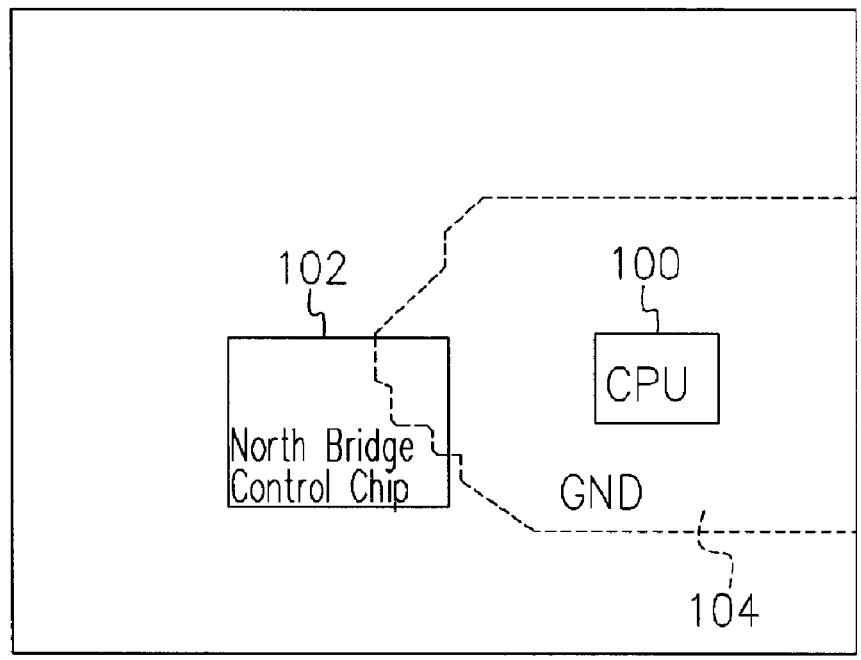
FIG. 1 schematically shows a power layer cut ichnography in the area where the north bridge control chip is coupled to the CPU in the conventional layout structure of the motherboard that supports the 423 pins Pentium IV CPU.

Comparing with FIG. 1, in the conventional layout structure, the power layer in the area where the north bridge control chip 102 is coupled to the CPU 100 only comprises the power cut area 104 of each interface, it does not comprise any cut area that is coupled to the grounded potential. Therefore, the major difference between the layout structure of the present invention and the conventional layout structure is the cut method of the power layer in the area where the north bridge control chip 202 is coupled to the CPU 200, so that the bottom solder layer of the preferred embodiment can refer to the grounded potential that is provided by the first reference area 204.

Since the signal transmission quality of the top signal layer is totally the same as the one of the bottom solder layer, compared with the prior art, the bottom solder layer of the present invention can be used to place the signals with high frequency, thus the area that can be used to place the signals is relatively expanded. Therefore, the part of the signals of the north bridge control chip that is coupled to the CPU can be placed on the bottom solder layer. Consequently, the objective of configuring a layout structure on the 4 layers motherboard to support the Pentium IV CPUs of two different package types can be achieved. On the other hand, the layout length traced on the area where the north bridge control chip is coupled to the CPU can be reduced, so that the area and the flexibility of the motherboard used to place other elements is relatively increased. Moreover, since the motherboard of the preferred embodiment according to the present invention can be used to install both Pentium IV CPUs mentioned above, therefore, as long as the design of the north bridge control chip is dedicated on the 4 layers stack structure motherboard that supports two CPUs mentioned above, the north bridge control chip that supports two CPUs mentioned above (such as the north bridge control chip P4X266 or P4M266 developed by VIA Technologies, Inc.) can be developed on the motherboard of the preferred embodiment according to the present invention, so that the development cost and time can be further saved.

In the motherboard of the preferred embodiment according to the present invention, the stack structure in the area where the north bridge control chip 200 is coupled to the CPU is schematically shown in Table 3:

TABLE 3

| The area of the north bridge control chip where its signals are not coupled to the CPU (the third area) | The area of the north bridge control chip where its signals are coupled to the CPU (the second area) | CPU (the first area) |
|---|---|---|
| Top Signal Layer | Top Signal Layer | Top Signal Layer |
| GND | GND | GND |
| The operating voltage of other interfaces | The operating voltage of GND and CPU | The operating voltage of GND and CPU |
| Bottom Solder Layer | Bottom Solder Layer | Bottom Solder Layer |

From Table 3, the printed circuit board uses a 4 layers stack structure, the printed circuit board comprises: a first area, the whole CPU is placed in the first area; a second area, all the signals of the north bridge control chip that are coupled to the CPU are placed in the second area; a third area, all the signals of the north bridge control chip that are not coupled to the CPU are placed in the third area. The stack structure of the first area from up to down sequentially comprises a top signal layer, a grounded layer having a grounded potential (GND), a power layer that comprises a first reference area having a grounded potential and a second reference area having a CPU operating voltage (also called as the core potential, Vcore), and a bottom solder layer. The stack structure of the second area from up to down sequentially comprises a top signal layer, a grounded layer having a grounded potential, a power layer that comprises a third reference area having a grounded potential and a fourth reference area having a core potential, and a bottom solder layer. Moreover, the stack structure of the third area from up to down sequentially comprises a top signal layer, a grounded layer having a grounded potential, a power layer having a plurality of the operating voltages of other interfaces, and a bottom solder layer. Since the north bridge control chip has to couple with other interfaces such as the south bridge control chip, the memory, and the graphics module element, and the corresponding interface operating voltage sources are demanded to process the needed operation, the needed voltage sources are generated from cutting and placing the third area power layer. Furthermore, all the signals of the CPU on the motherboard that are coupled to the north bridge control chip can be placed on the top signal layer and the bottom solder layer, and the signals that are placed on the bottom solder layer refer to the first reference area and the third reference area of the power layer. Obviously, since all the signals of the north bridge control chip that are coupled to the CPU can refer to the grounded potential, the high quality of the signal transmission can be assured.

Figure 3:
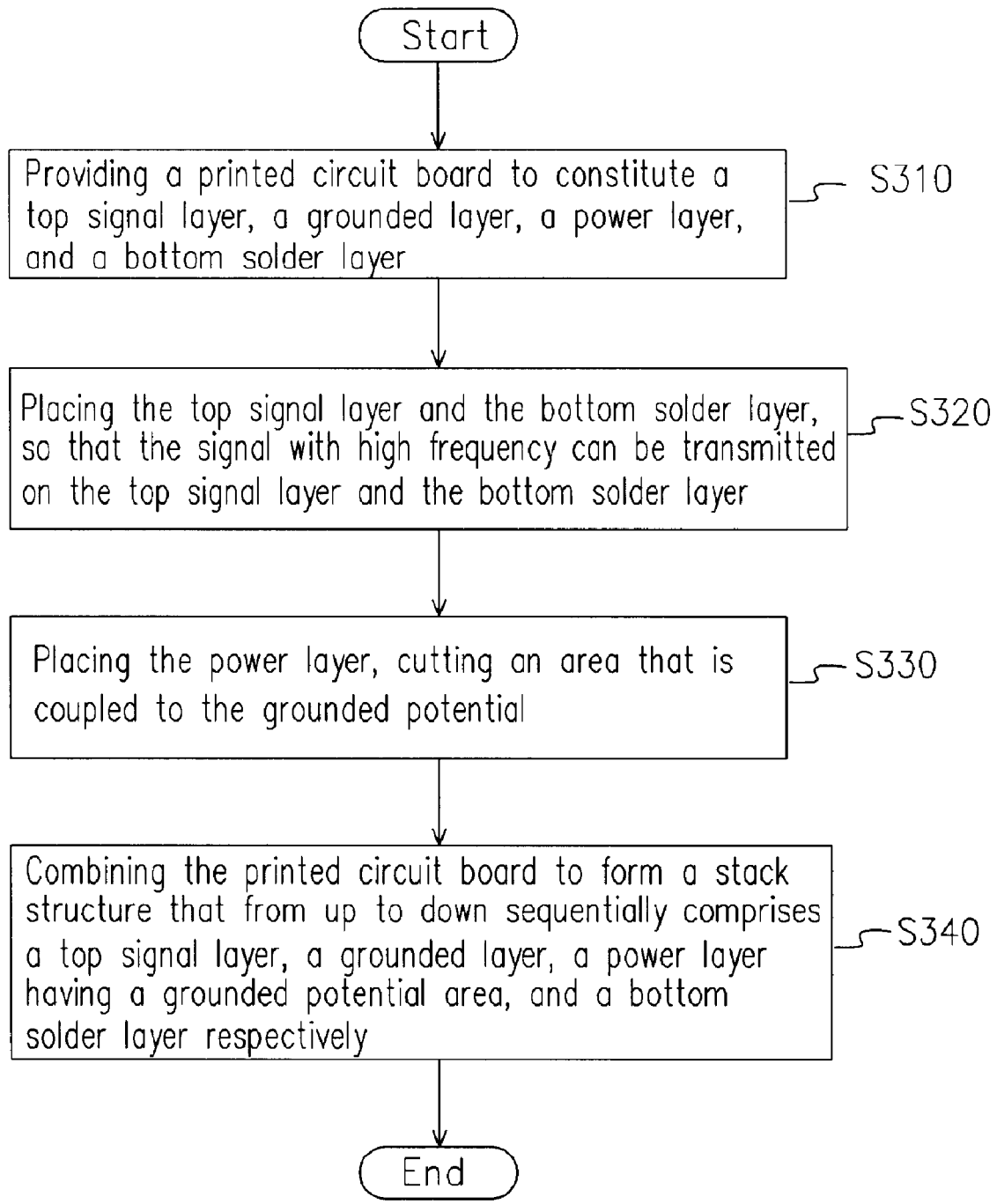
FIG. 3 schematically shows a layout method for supporting the CPUs of two different package techniques in the preferred embodiment of the present invention.

FIG. 3 schematically shows a layout method for supporting the CPUs of two different package techniques in the preferred embodiment of the present invention. The method comprises the steps of: at first, providing a plurality of printed circuit boards to constitute a motherboard, the plural printed circuit boards are used to place the top signal layer, the grounded layer having a grounded potential, the power layer, and the bottom solder layer that are needed for the motherboard (step s310). Then, placing the signal lines on the top signal layer and the bottom solder layer, wherein the high frequency signal lines can be placed on the top signal layer and the bottom solder layer in the area where the control chip is coupled to the CPU (step s320), so that high frequency signals can be transmitted on the bottom solder layer. Next, cutting the printed circuit board that is to be used to constitute a power layer to generate the voltage sources needed by the operating interfaces, and cutting an area on the power layer where the north bridge control chip is coupled to the CPU to generate an area that is coupled to the grounded potential (step s330). Since the contiguous layer of the top signal layer and the bottom solder layer comprises a grounded potential to refer to, the signal lines that are placed on the bottom solder layer have the same transmission quality as the signal lines on the top signal layer. Finally, combining the printed circuit boards mentioned above to constitute a 4 layers stack structure that from up to down sequentially comprises a top signal layer, a grounded layer having a grounded potential, a power layer having a grounded potential, and a bottom solder layer (step s340). Thus, the objective of designing a stack structure on a single motherboard to support two different Pentium IV CPUs can be achieved. Therefore, as long as the design of the north bridge control chip is dedicated on the motherboard that supports two Pentium IV CPUs mentioned above, the north bridge control chip that supports two CPUs mentioned above can be developed on the motherboard of the preferred embodiment according to the present invention.

In summary, the present invention has following advantages:

1. Since high frequency signals can be placed on the top signal layer and the bottom solder layer in the 4 layers stack structure motherboard, using less space compared to the prior art, a motherboard that supports the Intel Pentium IV CPUs of two different package types via a single layout structure and a single layout method is able to be designed. Therefore, it not only increases the usage convenience, but also saves cost.

2. Since all the signals of the north bridge control chip that are coupled to the CPU can be placed on the top signal layer and the bottom solder layer and all can refer to the grounded potential, the quality of the signal transmission can be assured.

3. Since the present invention can use a single motherboard to support two different Pentium IV CPUs, therefore, as long as the design of the north bridge control chip is dedicated on the single motherboard mentioned above, the objective of using one north bridge control chip to support the Intel Pentium IV CPUs of two different package types can be achieved.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A layout method for supporting a plurality of CPUs of different package techniques, comprising:

provinding a plurality of printed circuit boards;

placing on said printed circuit board that is used to constitute a top signal layer and a bottom signal layer, wherein said placement can be processed on said top signal layer and said bottom signal layer in said area where said control chip is coupled to the CPU;

cutting said printed circuit board that is used to constitute a power layer to cut off an area that is coupled to a reference potential on said power layer in said area where said control chip is coupled to the CPU; and combining said printed circuit board to form a stack structure.

2. The layout method of claim 1, wherein said stack structure comprises:

said top signal layer, used to place a first signal line in said area where said CPU is coupled to the control chip;

a reference potential providing layer, located below said top signal layer, coupled to the reference potential;

a power layer, located below said reference potential providing layer, comprising:

a voltage providing area for providing an operating voltage to the CPU and said control chip; and a reference potential providing area, coupled to the reference potential; and said bottom signal layer, located below said power layer, used to place a second signal line in said area where said CPU is coupled to the control chip.

3. The layout method of claim 1, wherein said first signal line refers to the reference potential providing layer.

4. The layout method of claim 1, wherein said second signal line refers to the reference potential providing area of said power layer.

5. The layout method of claim 1, wherein said stack structure is located in said area where said plurality of signals of said CPU is coupled to the plurality of signals of said control chip.

6. The layout method of claim 5, wherein said layout structure is placed on said motherboard.

7. The layout method of claim 1, wherein said reference potential is a grounded potential.

8. The layout method of claim 1, wherein said reference potential providing area is located in a first side of said control chip, and said CPU operating voltage providing area cuts into a second side of said control chip.

9. The layout method of claim 8, wherein said first side is said side nearest to the CPU, and said second side is a contiguous side of said first side.

10. The layout method of claim 1, wherein said CPU is either a CPU that has 423 pins and uses said pin grid array (PGA) package, or a CPU that has 478 pins and uses said ball grid array (BGA) package.

11. The layout method of claim 10, wherein said CPU having 423 pins and said CPU having 478 pins use a single control chip to support said CPU operation.

* * * * *